United States Patent [19]

Tada et al.

[11] Patent Number: 5,289,494
[45] Date of Patent: Feb. 22, 1994

[54] DISTRIBUTED FEEDBACK SEMICONDUCTOR LASER

[75] Inventors: Kunio Tada, Urawa; Yoshiaki Nakano, Tokyo; Takeshi Inoue, Urawa; Yi Luo, Tokyo; Takeshi Irita, Tokyo; Shin-ichi Nakajima, Tokyo; Hideto Iwaoka, Tokyo, all of Japan

[73] Assignee: Optical Measurement Technology Development Co., Ltd., Musashino, Japan

[21] Appl. No.: 899,860

[22] PCT Filed: Oct. 17, 1991

[86] PCT No.: PCT/JP91/01418

§ 371 Date: Jun. 17, 1992

§ 102(e) Date: Jun. 17, 1992

[87] PCT Pub. No.: WO92/07401

PCT Pub. Date: Apr. 30, 1992

[30] Foreign Application Priority Data

Oct. 19, 1990 [JP] Japan .................................. 2-282699
Jul. 22, 1991 [JP] Japan .................................. 3-181209

[51] Int. Cl.⁵ .............................................. H01S 3/08
[52] U.S. Cl. ........................................ 372/96; 372/45; 372/46
[58] Field of Search ............................. 372/96, 45, 46

[56] References Cited

U.S. PATENT DOCUMENTS

| | | | |
|---|---|---|---|
| 4,704,720 | 11/1987 | Yamaguchi | 372/96 |
| 5,061,030 | 10/1991 | Miyamoto et al. | 385/3 |
| 5,077,752 | 12/1991 | Tada et al. | 372/96 |
| 5,084,894 | 1/1992 | Yamamoto | 372/50 |
| 5,145,792 | 9/1992 | Hirata | 372/96 |
| 5,189,309 | 2/1993 | Wada et al. | 257/21 |

FOREIGN PATENT DOCUMENTS

| | | | |
|---|---|---|---|
| 60-164380 | 8/1985 | Japan . | |
| 0240178 | 11/1985 | Japan . | 372/96 |
| 63-29596 | 2/1988 | Japan . | |
| 63-189593 | 8/1988 | Japan . | |
| 1-168729 | 7/1989 | Japan . | |
| 3-49283 | 3/1991 | Japan . | |
| 3-49284 | 3/1991 | Japan . | |
| 3-49285 | 3/1991 | Japan . | |
| 3-49286 | 3/1991 | Japan . | |
| 3-49287 | 3/1991 | Japan . | |

OTHER PUBLICATIONS

H. Kogelnik et al, "Coupled-Wave Theory of Distributed Feedeback Lasers", Journal of Applied Physics, vol. 43, pp. 2327-2335 (1972).
Y. Luo et al, "Purely Gain-Coupled Distributed Feedback Semiconductor Lasers", Applied Physics Letters, vol. 56, pp. 1620-1622 (1990).
Y. Luo et al, "Gain-Coupled Distributed-Feedback Laser Diode", Extended Abstracts of the 20th (1988 Int'l) Conference on Solid State Devices and Materials, Tokyo pp. 327-330 (1988).
W. Streifer et al, "Coupled Wave Analysis of DFB and DBR Lasers", IEEE Journal of Quantum Electronics, vol. QE-13, pp. 134-141 (1977).
P. Daste et al, "Fabrication Technique for GaInAsP-/InP Quantum Wire Structure by LP-MOVPE" Journal of Crystal Growth, vol. 93, pp. 365-369 (1988).

Primary Examiner—Georgia Y. Epps
Attorney, Agent, or Firm—Cushman, Darby & Cushman

[57] ABSTRACT

This invention relates to a distributed feedback semiconductor laser which achieves distributed feedback by gain coupling by providing periodical changes in the thickness of the active layer (5) or the absorptive layer, and aims to achieve light distributed feedback mainly of periodical perturbation of the gain factor by diminishing the periodical perturbation of refractive index caused by the changes in the thickness of the active layer (5) or the absorptive layer. This invention is characterized by a refractive index canceling structure comprising a combination of layers (6) and (7) of different refractive indices to cancel periodical changes in refractive index caused by the periodical structure of the active layer (5) or the absorptive layer.

7 Claims, 5 Drawing Sheets

DISTRIBUTED FEEDBACK SEMICONDUCTOR LASER

TECHNICAL FIELD

This invention relates to a distributed feedback semiconductor laser which is used as an electro-optic converter. This invention relates, more particularly, to a gain-coupled distributed feedback laser diode (GC-DFB-LD).

This invention is highly suitable as the light source for a long-distance and large-capacity optical communication system, an optical information processing system, an optical memory system, an optical measuring instrument and other opto-electronic devices.

BACKGROUND TECHNOLOGY

The distributed feedback semiconductor laser generates stimulated emission of light by distributed optical feedback to an active layer with a diffraction grating provided near the active layer. The device can produce stimulated emission of excellent lasing spectral characteristics by a relatively simple construction, Therefore, it has been the target of various R & D efforts and is expected to be used as a light source suitable for a long-distance and large-capacity optical communication system, an optical information processing system, an optical memory system and an optical measuring instrument.

Such distributed feedback semiconductor laser has an optical waveguide structure, wherein an active layer is surrounded with transparent hetero-junction semiconductor layers, for efficient stimulated emission. R & D efforts are recently directed toward distributed feedback of light by periodically changing the refractive index in a transparent optical waveguide layer which is placed very close to the active layer. In that case, a diffraction grating, having triangular cross section for instance, is formed on the interface of the optical waveguide layer on the side farther from the active layer.

In the light distributed feedback by such index coupling, however, feedback to phase cannot be matched for the light in Bragg wavelength which is reflected correspondingly to the period of the thickness change in the optical waveguide layer. Because of this phase match condition, stable lasing cannot be obtained and two longitudinal lasing mode whose wavelengths are separated symmetrically in the vertical direction across the Bragg wavelength may possibly be generated at once. Even if only one such longitudinal-mode-lasing takes place, it is difficult to select previously which of the two wavelengths would be lasing. So, the precision in setting lasing wavelength is seriously deteriorated.

In sum, the light distributed feedback using index coupling which is based on the periodical perturbation of the refractive index in the optical waveguide layer has an inherent problem of degeneracy by longitudinal lasing mode of two wavelengths, which is difficult to avoid.

There have been proposed various solutions for the problem. One of them proposed a structure to shift the phase by ¼ wavelength substantially at the center of the diffraction grating. Those proposals, however, are not quite effective as they tend to make the construction of a laser more complicated, require additional manufacturing steps only for the solution of the degeneracy and need formation of anti-reflection coating on the facets of the laser.

Kogelnik et al. proposed a theory in their paper titled "Coupled-Wave Theory of Distributed Feedback Lasers", Journal of Applied Physics, 1972, Vol. 43, pp. 2327–2335, whereas a stop band is produced around the Bragg frequency when distributed feedback of the light is conducted by index coupling, if distributed feedback is conducted by gain coupling based on the periodical perturbation of gain factors, such stop band would not be produced and longitudinal mode lasing of exclusively single wavelength would be obtained. They did not mention in their paper the specific construction to realize the theory, rather they merely discussed on the result of their theoretical studies.

Some of the present inventors have invented novel semiconductor lasers applying the basic theory of Kogelnik et al., and filed patent applications as follows:

Japanese Patent Application No. 63-189593, filed on Jul. 30, 1988

Japanese Patent Application No. 1-168729, filed on Jun. 30, 1989 (Publication No. JP-A 3-34489)

Japanese Patent Application No. 1-185001 to 1-185005 filed on Jul. 18, 1989) (Publication No. JP-A 3-49283 to 3-49287)

The inventors succeeded in realizing distributed feedback by gain coupling by the invention constructions which were indicated in the respective specifications and drawings. Many of the constructions shown in these patent applications are provided with periodical corrugation on the surface of an active layer to utilize the periodical perturbation of gain factors caused by the changes in thickness.

The refractive index of the active layer is usually different from that of the surrounding layers as it is necessary to confine the light. If the active layer is corrugated, the refractive index inevitably changes periodically. In other words, the construction having a corrugated surface on the active layer did not achieve the distributed feedback by gain coupling only, but was still subject to the effect of perturbation caused by the index coupling.

Some of the present inventors therefore proposed a design that would diminish the perturbation caused by the index coupling so as to obtain the perturbation caused by the gain coupling alone in the paper, "Purely gain-coupled distributed feedback semiconductor lasers", by Y. Luo, Y. Nakano, K. Tada, T. Inoue, H. Hosomatsu and H. Iwaoka, Appl. Phys. Lett. 56 (17), Apr. 23, 1990, pp. 1620–1622. According to the proposed construction, the thickness of an active layer is periodically changed to provide gain coupling components, and the perturbation of the refractive index due to the corrugated surface of the active layer is canceled by the refractive index perturbation of another corrugation provided nearby with the opposite phase. The GC-DFB-LD which does not substantially contain the index coupling components is herein referred to as a "pure GC-DFB-LD".

Because the overflow of carriers from the active layer should be inhibited, materials of the layers on both sides of the active layer should have sufficiently wide band gap compared to that of the active layer. Such materials, however, have low refractive index, and therefore tend to change the magnitude of the perturbation of refractive index sensitivity to the forms of the two corrugations, for instance, the tooth height of the two corrugations. In order to effectively cancel the perturbation of refractive index, an extremely high manufacturing precision is required.

In the GC-DFB-LD of GaAs based materials which has been realized so far, it was not considered to be a problem because high reproducibility both in their diffraction gratings and the growth shape was relatively easily realized with AlGaAs. But when index coupling components are attempted to be completely eliminated in a device of GaAs based materials, or when the material is inferior in manufacturing precision for canceling the perturbation of refractive index, the process should be controlled thoroughly and strictly.

It is an object of this invention to provide a distributed feedback semiconductor laser which can solve the above mentioned problems of the prior art, which can diminish distributed feedback caused by index coupling and which can obtain the distributed feedback caused mainly by gain coupling.

DISCLOSURE OF THE INVENTION

The first aspect of this invention provides a distributed feedback semiconductor laser comprising a layer of lower refractive index than that of the active layer provided at the peaks of the corrugation, a layer of an intermediate refractive index provided adjacent to the corrugation, and a layer having a refractive index which is higher than that of the layer of lower refractive index and lower than that of the active layer. The corrugation is provided on the surface of the active layer as a diffraction grating.

The refractive indices of the active layer, the intermediate-refractive-index layer and the lower-refractive-index layer, the depth of the corrugation and the thickness of the intermediate-refractive-index layer are preferably as determined as to cancel the periodic changes of the refractive index caused by the active layer and the intermediate-refractive-index layer by the periodic changes of the refractive index caused by the lower-refractive-index layer and the intermediate-refractive-index layer.

In order to manufacture such a laser diode, an active layer is grown on a substrate, then a lower-refractive-index layer having a refractive index lower than that of the active layer is grown thereon. The lower-refractive-index layer and the active layer are etched to have a periodical corrugation as a diffraction grating. Then an intermediate-refractive-index layer having a refractive index higher than that of the lower-refractive-index layer and lower than that of the active layer is grown.

By adjusting the refractive index and the thickness of the intermediate-refractive-index layer to correspond to the forms of the diffraction grating etched on the lower-refractive-index layer and the active layer, the components of index coupling can be controlled with precision.

The distributed feedback semiconductor laser obtains the periodic perturbation of gain factors by periodically changing the thickness of the active layer.

By providing a low-refractive-index layer at each peak of the corrugation on the surface of the active layer, and by further providing an intermediate-refractive-index layer adjacent to the corrugation, a periodic structure is formed at the valleys of the corrugation comprising the active layer, the intermediate-refractive-index layer, the active layer, the intermediate-refractive-index layer and its repetition. Another periodic structure is formed at the peaks of the corrugation comprising the lower-refractive-index layer, the intermediate-refractive-index layer, the lower-refractive-index layer, intermediate-refractive-index layer and its repetition. The refractive indices of those parts will become as below:

On the valley side:
    High (active layer)-intermediate-high-intermediate . . .

On the peak side:
    Low-intermediate-low-intermediate . . .

In other words, the periodic constructions on the valley side and on the peak side become reverse in the phase to one another, whereby the periodical changes of the refractive indices thereof can be canceled.

This restricts the periodic perturbation of index coupling, enables distributed feedback mainly of the periodic perturbation of gain factors which is caused by the periodic changes in the thickness of the active layer and produces stable single mode lasing.

The second aspect of this invention aims to provide a distributed feedback semiconductor laser comprising an active layer to generate stimulated emission, and a absorptive layer provided near the active layer and made of a material which absorbs the stimulated emission of light from the active layer. The absorptive layer has periodically changing thicknesses to give distributed feedback of the stimulated emission from the active layer. It is characterized in that the periodic changes in the refractive index, which is caused by the changes in the thickness of the absorptive layer, is canceled with a combination of layers of different refractive indices.

According to the first aspect of the invention, the thickness of the active layer is periodically changed and the perturbation of refractive index is canceled by the combination of different refractive indices. According to the second aspect of this invention, by changing periodically the thickness of the absorptive layer instead of the active layer, gains are changed effectively. Further, the perturbation of refractive index caused by the changes in thickness of the absorptive layer is canceled by the combination of layers of different refractive indices. This eliminates components of index coupling, and distributed feedback can be achieved substantially by the changes in the optical absorption or the changes in the effective gain alone.

The construction for obtaining distributed feedback by gain coupling by providing a periodical absorptive layer near the active layer is discussed in detail in the paper: "Fabrication and Characteristics of a Gain-coupled Distributed-feedback Laser Diode," by Y. Luo, Y. Nakano and K. Tada, Extended Abstracts of the 20th (1988 International) Conference on the Solid State Devices and Materials, Tokyo, pp. 327–330.

The layer construction for canceling the periodic changes in the refractive index preferably includes a lower-refractive-index layer wherein its thickness changes in the same phase as the periodic change of thickness of the absorptive layer but which has a refractive index lower than the absorptive layer, and an intermediate-refractive-index layer wherein its thickness changes in the opposite phase to the periodic change of the thickness of the absorptive layer and whose refractive index is between that of the absorptive layer and that of the lower-refractive-index layer.

In order to cancel the index coupling component with due consideration to the weight of electric field intensity, the refractive indices, thicknesses and duty ratios of the absorptive layer, the intermediate-refractive-index layer and the lower-refractive-index layer should respectively be determined to satisfy either one of the following conditions:

(1) The periodic changes in refractive index caused by the absorptive layer and the intermediate refractive index layer are canceled by the periodic changes in refractive index caused by the lower-refractive-index layer and the intermediate-refractive-index layer.

(2) The periodic changes in refractive index caused by the absorptive layer and the lower-refractive-index layer are canceled by the periodic changes in refractive index caused by the lower-refractive-index layer and the intermediate-refractive-index layer.

In addition to these conditions, in the case where a higher order diffraction grating is used, the refractive indices, thicknesses and duty ratios of the absorptive layer, the intermediate-refractive-index layer and the lower-refractive-index layer could respectively be determined to satisfy either one of the following conditions where the phases of periodic changes in refractive index are shifted from the conditions mentioned above:

(3) The periodic changes in refractive index caused by the absorptive layer and the intermediate-refractive-index layer are canceled by the periodic changes in refractive index caused by the intermediate-refractive-index layer and the lower-refractive-index layer.

(4) The periodic changes in refractive index caused by the absorptive layer and the lower-refractive-index-layer are canceled by the periodic changes in refractive index caused by the intermediate-refractive-index layer and the lower-refractive-index layer.

In these cases, the absorptive layer and the lower-refractive-index layer are preferably arranged close to or adjacent to each other. The intermediate-refractive-index layer may be arranged on the opposite side of the lower-refractive-index layer across the absorptive layer or on the opposite side of the absorptive layer across the lower-refractive-index layer.

In the arrangement such as above, the imaginary part of the coupling coefficient, or the gain coupling coefficient is generated by absorption by the absorptive layer and will not be canceled. Therefore, distributed feedback of the light is achieved substantially by gain coupling only.

It is preferable to fabricate the thinner portion of the absorptive layer as thin as possible in order not to increase the loss caused by the optical absorption unnecessarily. It is further preferable to segment the absorptive layer so that the thicker portion, or the portion where the absorptive layer exists, concentrates corresponding to the nodes of the standing wave.

The referred combination of refractive indices which can cancel the perturbation of refractive index in respect of the first and second aspects is selected in a manner to cancel the real part of the coupling coefficient $\kappa$ expressed by the equation below: The real part of the coupling coefficient $\kappa$ represents the component of index coupling. More particularly, the coupling coefficient $\kappa$ is represented by the following equation given the direction vertical to the face of the diffraction grating x, and the direction of optical propagation z, $$\kappa = (k_0^2/2\beta_0 P) \int A_q(x) \epsilon_0(x) \epsilon_0^*(x) dx$$

where:

$k_0$: wave number in a free space $\beta_0$: propagation constant in z direction $A_q$: component of the q-th order when the squares of the refractive indices is Fourier expanded in the z direction $\epsilon_0$: electric field intensity P: constant obtained by integrating $\{\epsilon_0(x) \epsilon_0^*(x)\}$ in the x direction In the case of the first order grating, the sign of the Fourier coefficient $A_q(x)$ is determined only by the sign of the difference in the squares of the refractive indices. Therefore the sign of the difference in the squares of the refractive indices in the integration is inverted, the coupling coefficient is canceled and becomes diminished, and in an optimal case, the component of index coupling can be designed as zero. In addition, in the case of higher order diffraction grating, the sign may also be inverted by the width per one period, or the duty ratio. The design should take the duty ratio into consideration. The above equation is given to obtain the coupling coefficient using Fourier expansion and is described in the paper by W. Striefer et al., IEEE J. Quantum Electronics QE-13, p. 134, 1977.

The word pertaining to "up" or "above" in this specification means the direction identical to the direction of the growth of crystals at the time of manufacture, or the direction away from the substrate, and the word pertaining to "below" means the direction opposite thereto.

OPTIMAL MODE TO REALIZE THE INVENTION

Figure 1:
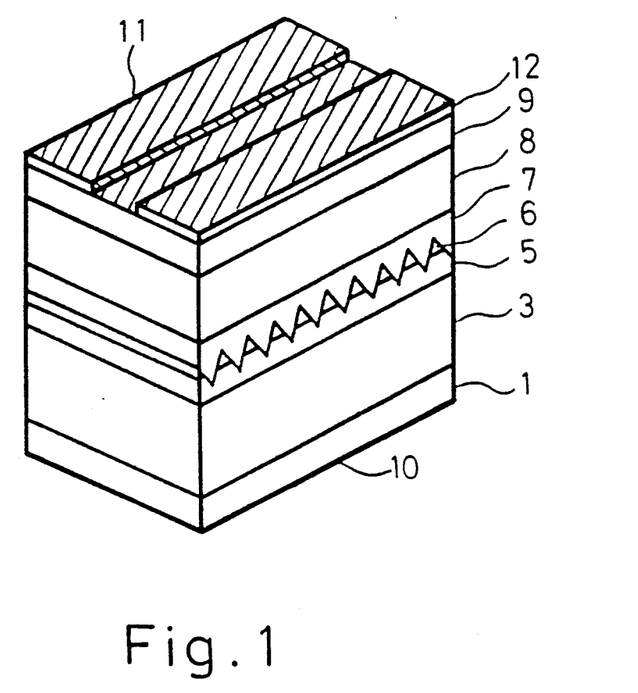
FIG. 1 is a perspective view to show the construction of the first embodiment of this invention.

FIG. 1 shows the construction of an embodiment of this invention distributed feedback semiconductor laser.

The laser includes an active layer 5 for generating stimulated emission of light, and a diffraction grating which is formed as corrugation on the surface of the active layer 5 for achieving distributed feedback of the stimulated emission from the layer 5.

This invention is characterized in that a layer 6 having a refractive index lower than that of the active layer 5 is provided on each peak of the corrugation while an intermediate-refractive-index layer 7 having a refractive index higher than that of the layer 6 but lower than that of the active layer 5 is provided adjacent to the corrugation.

The construction as well as the manufacture method of the laser will be described further in detail below.

The InP based materials where the layers are lattice-matched to InP will be described as an example.

Layers of double-hetero-junction structure are grown epitaxially in two stages on an n-type InP substrate of high carrier concentration. The layers are lattice-matched to the InP substrate 1.

In the first stage of epitaxial growth, on the substrate 1 are sequentially grown in crystals, for example, an n.type InP cladding layer 3 of the thickness of 1 $\mu$m, an active layer 5 of $In_{0.53}Ga_{0.47}As$ of low impurity concentration of the thickness of 0.12 $\mu$m, and a lower-refractive-index layer 6 of p-type InP of the thickness of 40 nm. Then, by the holographic exposure method and chemical etching, the lower-refractive-index layer 6 and the active layer 5 are etched to form a diffraction gratings (in corrugation) of the period of 256 nm and the depth of 80 nm.

In the second stage of the epitaxial growth, an intermediate-refractive-index layer 7 of p-type InGaAsP of the average thickness of 60 nm (the band gap $\lambda_g = 1.3$ $\mu$m in terms of optical wavelength) is grown further on the active layer 5 and the lower-refractive-index layer 6 which are etched with the diffraction grating. The upper surface of the layer 7 is formed flat. Then, a p-type InP cladding layer 8 of the thickness of 1 $\mu$m and a high carrier concentration p-type $In_{0.53}Ga_{0.47}As$ contact layer 9 of the thickness of 0.5 $\mu$m are grown sequentially to complete the double-hetero-junction structure.

As the sides of the active layer 5 are exposed after the etching, it is necessary to slightly etch them immediately before the crystal growth to avoid formation of defects. In the InP based materials there is no possibility of defect if an appropriate processing is conducted, as is discussed in J. Cryst. Growth, 93 (1988) pp. 365-369.

After the second epitaxial growth, an $SiO_2$ insulation layer 12 is deposited on the upper surface of the contact layer 9 to form windows in the form of stripes of the width of 10 $\mu$m, then electrode layers 10 and 11 are evaporated. Then, the structure is cleaved into individual semiconductor lasers.

The growth conditions in metal-organic vapor phase epitaxy (MOVPE) are, for examples, as below.

| [materials] | phosphine | $PH_3$ |
|---|---|---|
| | arsine | $AsH_3$ |
| | triethylindium | $(C_2H_5)_3In$ |
| | triethylgallium | $(C_2H_5)_3Ga$ |
| | dimethylzinc | $(CH_3)_2Zn$ |
| | hydrogen sulfide | $H_2S$ |
| [conditions] | pressure | 76 Torr |
| | total flow rate | 6 slm |
| | substrate temperature | 700° C. (for the first stage of growth) |
| | | 650° C. (for the second stage of the growth) |

The conduction types and compositions of the above mentioned layers are shown below.

| substrate 1 | $n^+$-InP |
|---|---|
| cladding layer 3 | n-InP |
| active layer 5 | i-$In_{0.53}Ga_{0.47}As$ |
| lower - refractive - index layer 6 | p-InP |
| intermediate - refractive - index layer 7 | p-InGaAsP ($\lambda_g = 1.3$ $\mu$m) |
| cladding layer 8 | p-InP |
| contact layer 9 | $p^+$-$In_{0.53}Ga_{0.47}As$ |

Figure 2:
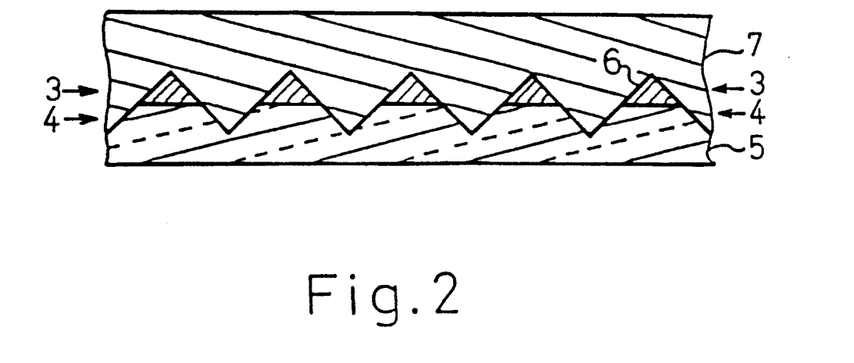
FIG. 2 is a cross section to show the layer structure in the vicinity of the an active layer.
Figure 3:
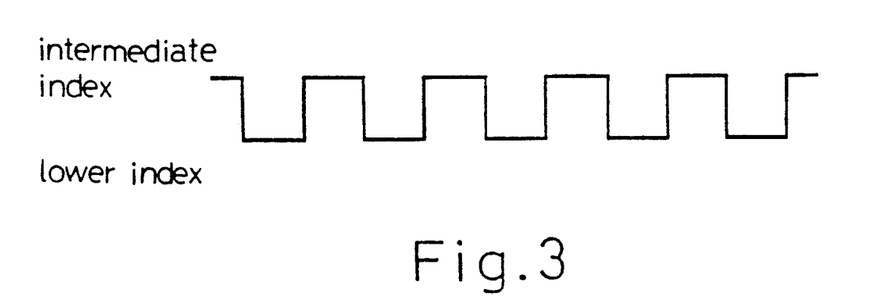
FIG. 3 is a view to show the distribution of refractive indices along the line 3—3 in FIG. 2.
Figure 4:
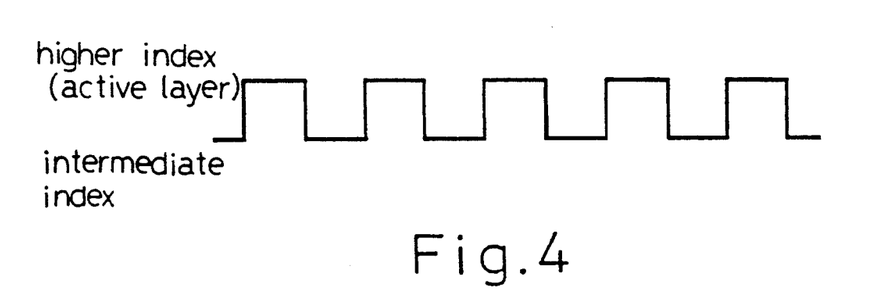
FIG. 4 is a view to show the distribution of refractive indices along the line 4—4 in FIG. 2.

FIG. 2 shows the layer structure in the vicinity of the active layer of the aforementioned embodiment. FIGS. 3 and 4 show respectively the distribution of refractive indices along the lines 3—3, 4—4 in FIG. 2.

The perturbation of the refractive index caused by the active layer 5 with an etched diffraction grating and the intermediate-refractive-index layer 7 which fills in the etched dents is canceled by the perturbation of the refractive index caused in the reverse phase by the segmented lower-refractive-index layer 6 and the intermediate-refractive-index layer 7 which fills in the cuts. The composition and thickness of the layers mentioned above are one example of the design which could make the perturbation of the refractive index substantially zero.

The upper surface of the intermediate-refractive-index layer 7 is made flat to facilitate design calculations. If there are left some irregularities on the upper surface, the perturbation of the refractive index thereof should be taken into consideration in order to cancel the perturbation as a whole.

As is stated in the foregoing, a distributed feedback semiconductor laser can be obtained which can diminish perturbation of the refractive index so as to realize distributed feedback mainly of the perturbation of the gain factor of the active layer 5 etched with a diffraction grating to conduct single mode lasing in the Bragg wavelength which corresponds to the period of the gain factor.

Figure 5:
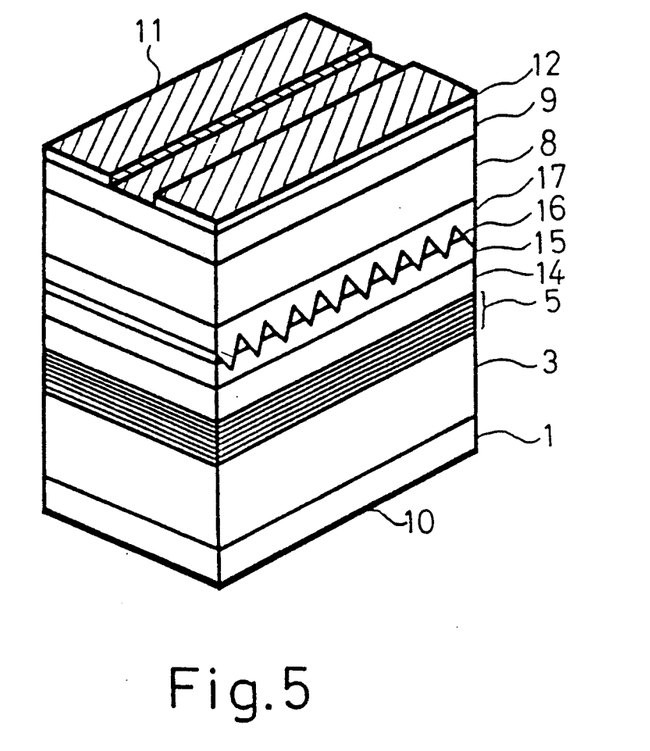
FIG. 5 is a perspective view to show the structure of the second embodiment of this invention.
Figure 6:
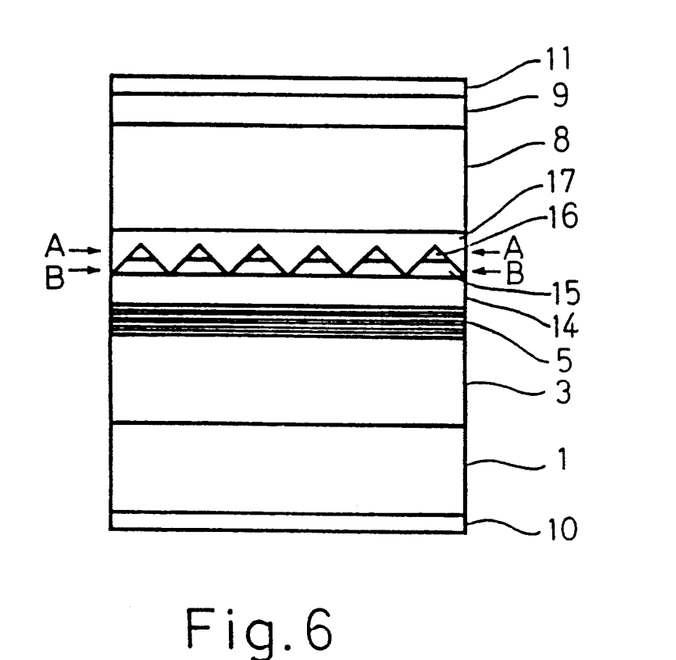
FIG. 6 is a cross section along the stripe.

FIG. 5 is a perspective view to show the construction of the second embodiment of this invention distributed feedback semiconductor laser, and FIG. 6 is a cross section thereof along the stripe.

There is provided on a substrate 1 a cladding layer 3, an active layer 5 which generates stimulated emission on the cladding layer 3. A layer for confinement of carriers 14 is provided on the active layer 5, and a lower-refractive-index layer 15 and an absorptive layer 16 are sequentially grown on the layer 14. An intermediate-refractive-index layer 17 is provided on the lower-refractive-index layer 16. On the intermediate-refractive-index layer 17, there are provided a cladding layer 8 and a contact layer 9. An electrode 10 is connected to the lower surface of the substrate 1 while an electrode 11 is connected to the upper surface of the contact layer 9 through a striped window provided on an insulation layer 12.

A periodic corrugation is formed on the upper surface of the lower-refractive-index layer 15 and the absorptive layer 16 is arranged on the peaks thereof. This structure is obtained by epitaxially growing the layers 15 and 16 flat and then etching them to segment the layer 16. It can also be obtained by growing the layers 15 and 16 while controlling the crystal planes. The intermediate-refractive-index layer 17 is formed in a manner to bury the segmented absorptive layer 16. As the layer 16 is periodically segmented, the absorption changes in the period and distributed feedback is realized.

The lower-refractive-index layer 15 and the intermediate-refractive-index layer 17 are designed to cancel the periodical changes in refractive index caused by the changes in the thickness of the layer 16 by means of a combination of different refractive indices. In other words, the refractive indices and the thicknesses of the layers 15 and 17 respectively are determined as relative to the refractive index and thickness of the absorptive layer 16 so as to cancel the periodical changes in refractive index caused by the layers 16 and 17 with the periodical changes in refractive index caused by the layers 15 and 17.

In the area where the layers 16 and 17 are alternately arranged on the same plane or along the line A—A in FIG. 6 and where the layers 15 and 17 are alternately arranged on the same plane of along the line B—B of the figure, the refractive index changes as below:

- A—A: intermediate-high-intermediate-high-intermediate
- B—B: intermediate-low-intermediate-low-intermediate The refractive index is high in the absorptive layer 16. Therefore, the changes in the refractive indices are canceled with one another. The accurate conditions for cancel are obtained according to the method of calculating the coupling coefficient by Streifer et al. The distributed feedback can therefore be realized by changing the absorption or the net gain.

It is preferable to select the compositions for the lower-refractive-index layer 15 and the intermediate-refractive-index layer 17 to have sufficiently low optical absorption and yet to have the refractive indices close to that of the absorptive layer 16 respectively. Taking an example of InP based materials, conduction types and compositions are shown below:

| | |
|---|---|
| substrate 1 | $n^+$-InP |
| cladding layer 3 | n-InP |
| active layer 5 | multi-quantum well (effective $\lambda_g = 1.55\ \mu m$) layer of i-InGaAsP ($\lambda_g = 1.3\ \mu m$) and $In_{0.53}Ga_{0.47}As$ |
| carrier confinement layer 14 | p-InP |
| lower-refractive-index layer 15 | p-InGaAsP ($\lambda_g = 1.3\ \mu m$) |
| absorptive layer 16 | p-InGaAsP ($\lambda_g = 1.55\ \mu m$) |
| intermediate-refractive-index layer 17 | p-InGaAsP ($\lambda_g = 1.4\ \mu m$) |
| cladding layer 8 | p-InP |
| contact layer 9 | $p^+$-$In_{0.53}Ga_{0.47}As$ | wherein: $\lambda_g$ denotes the wavelength of the light corresponding to the band gap energy, and the quaternary alloy is lattice-matched to InP.

The active layer 5 and the absorptive layer 16 may be either the single quantum well layers or the multi-quantum well layers. Alloys may be used. The positions of the absorptive layer 16 and the lower refractive index layer 15 are interchangeable.

Figure 7:
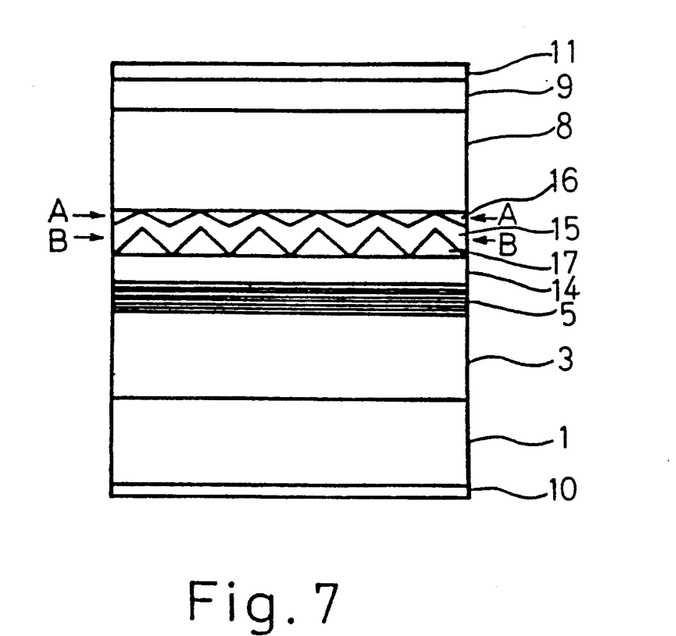
FIG. 7 is a cross section to show the structure of the third embodiment of this invention along the stripe.

FIG. 7 is a cross sectional view of the third embodiment of this invention shown along the stripe. The third embodiment differs from the second embodiment in the relative positions and the shapes of the lower-refractive-index layer 15, the absorptive layer 16 and the intermediate-refractive-index layer 17 respectively. More particularly, the intermediate-refractive-index layer 17 on which surface is formed a periodic corrugation is provided on the carrier confinement layer 14. A lower-refractive-index layer 15 is formed on the intermediate-refractive-index layer 17 in a manner to reflect the effect of the corrugation on the surface. A absorptive layer 16 is further formed thereon in a manner to fill the dents in the corrugation and to substantially make the top surface flat. In other words, the thickness of the absorptive layer 16 changes periodically.

In the area where the absorptive layer 16 and the lower-refractive-index layer 15 are alternately arranged within the same plane or along the line indicated at A—A and the area where the lower-refractive-index layer 15 and the intermediate-refractive-index layer 17 are arranged alternately within the same plane or along the line indicated with B—B in FIG. 7, the refractive index changes as follows:

- A—A: high-low-high-low-high
- B—B: low-intermediate-low-intermediate-low

Therefore, the changes in the refractive index are canceled. Alternatively, these two corrugated areas may be penetratingly combined to make an area where the refractive index changes as follows:

-high-low-intermediate-low-high-low-intermediate-low-high

The coupling coefficient can be similarly calculated.

The conduction types and compositions of the layers in this embodiment may be similar to those mentioned above.

Figure 8:
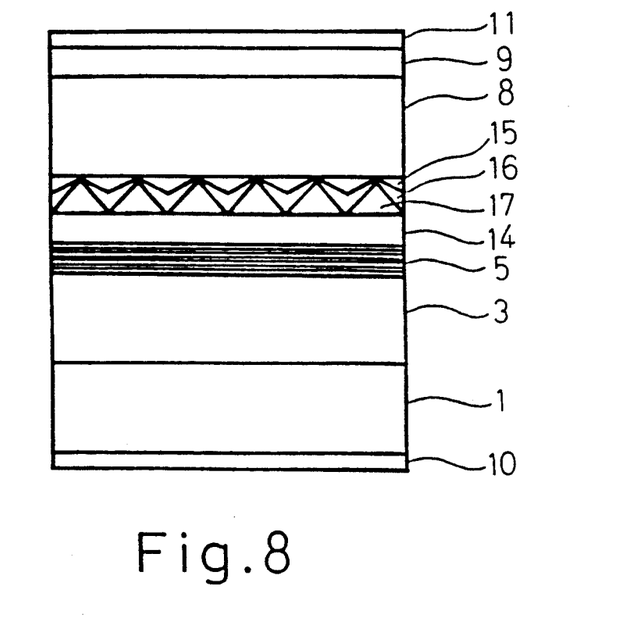
FIG. 8 is a cross section to show the structure of the fourth embodiment of this invention along the stripe.

FIG. 8 shows in section the fourth embodiment of this invention structure along the stripes. This embodiment of this invention structure along the stripes. This embodiment differs from the third embodiment in that the absorptive layer 16 is replaced with the lower-refractive-index layer 15. The operation thereof is similar to that of the third embodiment.

Figure 9:
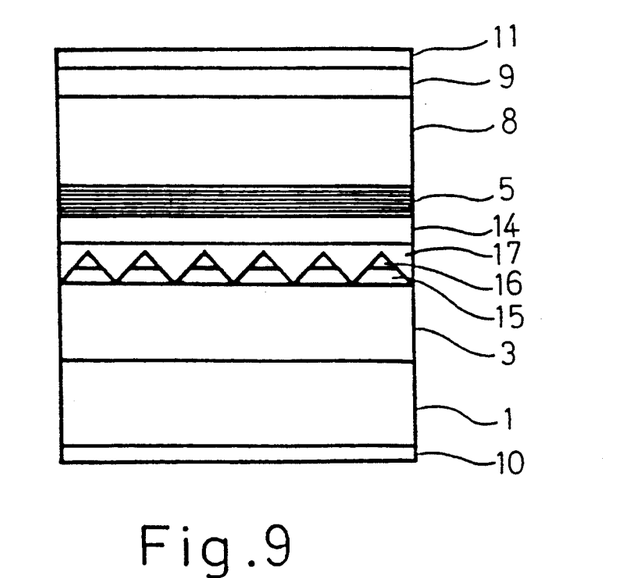
FIG. 9 is a cross section to show the structure of the fifth embodiment of this invention along the stripe.

FIG. 9 shows in section the fifth embodiment of this invention structure along the stripes. This embodiment differs from the second embodiment in that the position of the portion comprising the lower-refractive-index layer 15, the absorptive layer 16 and the intermediate-refractive-index 17 is replaced with the position of the active layer 5. In other words, on the cladding layer 3 are formed the lower-refractive-index layer 15, the absorptive layer 16 and the intermediate-refractive-layer 17. Further, the active layer 5 is formed thereon via a carrier confinement layer 14. In this structure, the conduction types of some of the layers become opposite to those in the second embodiment. An example of the conduction types and compositions are shown below:

| | |
|---|---|
| substrate 1 | $n_+$-InP |
| cladding layer 3 | n-InP |
| lower-refractive-index layer 15 | n-InGaAsP ($\lambda_g = 1.3\ \mu m$) |
| absorptive layer 16 | n-InGaAsP ($\lambda_g = 1.55\ \mu m$) |
| intermediate-refractive-index layer 17 | n-InGaAsP ($\lambda = 1.4\ \mu m$) |
| carrier confinement layer 14 | n-InP |
| active layer 5 | multi-quantum well (effective $\lambda_g = 1.55\ \mu m$) layer of i-InGaAsP ($\lambda_g = 1.3\ \mu m$) and $In_{0.53}Ga_{0.47}As$ |
| cladding layer 8 | p-InP |
| contact layer 9 | $p^+$-$In_{0.53}Ga_{0.47}As$ | wherein $\lambda_g$ denotes the light wavelength corresponding to the band gap energy and the quaternary alloy is lattice-matched to InP.

In the third and fourth embodiments, the positions of the area comprising the lower-refractive-index layer 15, the absorptive layer 16 and the intermediate-refractive-index layer 17 and that of the active layer 5 are interchangeable.

INDUSTRIAL APPLICABILITY

As described in the foregoing, the distributed feedback semiconductor laser according to this invention has smaller changes of the refractive index as a whole to thereby diminish periodical perturbation of the refractive index. This enables distributed feedback mainly of the periodical perturbation of gain factor which is caused by the periodical changes in the thickness of the active layer or the absorptive layer, which in turn enables lasing in single mode.

Unlike the prior art distributed feedback semiconductor laser of index coupling type, this invention distributed feedback semiconductor laser achieves distributed feedback by gain coupling, and is capable of lasing in completely single wavelength, and instability in lasing wavelength which was often observed in the prior art is expected to be overcome. Completely single longitudinal mode lasing may be achieved by the prior art lasers, but it entails such inconveniences as that the structure of the semiconductor lasers becomes very complicated, and that the number of manufacturing steps increases as it requires formation of anti-reflection coating on the facet of a laser diode. This invention laser can realize single longitudinal mode lasing without the need to modify the conventional manufacturing steps or to provide anti-reflection coating. Moreover, as this invention laser utilizes distributed feedback by gain coupling, the noise caused by the external optical feedback from either a remote end or a adjacent end, if any, can be remarkably reduced from those expected in the prior art lasers using index coupling.

As this invention laser can easily use quantum well layer as the active layer, it can fully utilize their advantages. For example, a quantum well active layer has the gain in TE mode larger than that in TM mode to thereby enable TE mode lasing selectively. The distributed feedback semiconductor laser according to this invention can generate very short pulses in high speed current modulation and is expected to have less chirping in the lasing wavelength.

The distributed feedback semiconductor laser according to this invention is therefore not only very promising as the high performance light source necessary for long-distance and large-capacity optical communication systems, but also is expected to be used as a small sized light source of high performance which can replace conventional gas lasers or solid lasers used in the fields of optical information processing and recording systems, optical measuring instruments, and as the light source for high speed optical phenomena.

When distributed feedback based on the perturbation of the absorption or periodic changes of the net gain is used, components of index coupling can be reduced as compared with the conventional structure which is simply added with a absorptive layer, and in the threshold gain. differences can be increased to thereby improve characteristics.

When compared with the structure wherein the components of index coupling are canceled by devising the forms in the vicinity of the active layer having periodically changing thickness, manufacture of the present invention laser is facilitated in the following aspects.

Firstly, canceling of the components of index coupling becomes easier. This is because unlike the case where as active layer thickness is changed, use of the absorptive layer lifts the restrictions on the compositions of the lower-refractive-index layer and of the intermediate-refractive-index layer imposed by the problem of overflow of carriers, and the difference in refractive indices of the absorptive layer and of the lower-refractive-index layer can be made smaller. Even if there are minor variations in the forms, the magnitude of residual index coupling due to the variations can be reduced by the decrement in refractive index difference @ore precisely, difference in the squares of refractive indices), giving an allowance in the manufacturing precision.

Secondary, as the absorptive layer can be reduced in the thickness by selecting an the adequate composition to effectively absorb the light, the necessary depth in the corrugation can be reduced. This contributes to alleviating the conditions for etching the corrugation or for regrowth thereon.

Thirdly, as compared to the case where the active layer is corrugated, the active layer is less prone to damages. The absorptive layer is less influenced by the problem of re-growth than the active layer.

This invention can be realized without being extremely limited in materials, and realize a pure GC-DFB-LD by using various materials such as InP based materials in addition to GaAs based materials.

What is claimed is:

1. In a distributed feedback semiconductor laser comprising:
    an active layer to generate stimulated emission,
    a periodical structure to give light distributed feedback of stimulated emission from the active layer, and
    a refractive index canceling structure to cancel the periodical changes in the refractive index caused by the periodical structure,
  wherein:
    said periodical structure is formed as corrugation on the surface of said active layer, and
    said refractive index canceling structure includes
    a lower-refractive-index layer having a refractive index which is lower than that of said active layer and provided on each of a plurality of peaks of said corrugation, and
    an intermediate-refractive-index layer provided in contact with said corrugation and having a refractive index higher than that of said lower-refractive-index layer and lower than that of said active layer.

2. The distributed feedback semiconductor laser as claimed in claim 1 wherein respective indices of the active layer, the intermediate-refractive-index layer and the lower-refractive-index layer, the depth of the corrugation and the thickness of the intermediate-refractive-index layer are determined in a manner to cancel the periodical changes of refractive index caused by said active layer and said intermediate-refractive-index layer with the periodical changes of refractive index caused by said lower-refractive-index layer and said intermediate-refractive-index 3. In a distributed feedback semiconductor laser comprising:
    an active layer to generate stimulated emission,
    a periodical structure to give light distributed feedback of the stimulated emission from said active layer,
    a refractive index canceling structure to cancel the periodical changes in refractive index caused by the periodical structure, and
    an absorptive layer formed near said active layer with a material which absorbs the stimulated emission generated by the active layer, and wherein:
    said periodical structure is formed as changes in the thickness of the absorptive layer, and
    said refractive index canceling structure includes a layer in a location where it can cancel the periodical changes in refractive index caused by the changes in the thickness of said absorptive layer by an adequate combination of layers of different refractive indices.

4. The distributed feedback semiconductor laser as claimed in claim 3 wherein said layer structure for canceling the periodical changes in refractive index includes a lower-refractive-index layer whose thickness changes in the same phase as the period of the thickness of the absorptive layer and which has a refractive index lower than that of the absorptive layer, and an intermediate-refractive-index layer whose thickness changes in a phase opposite to the period of the thickness of said absorptive layer and which has a refractive index intermediate of said absorptive layer and said lower-refractive-index layer.

5. The distributed feedback semiconductor laser as claimed in claim 4 wherein the absorptive layer is arranged between the lower-refractive-index layer and the intermediate-refractive-index layer.

6. The distributed feedback semiconductor laser as claimed in claim 4 wherein the lower-refractive-index layer is arranged between the absorptive layer and the intermediate-refractive-index layer.

7. The distributed feedback semiconductor laser combination as claimed in claim 3, wherein said absorptive layer is sufficiently near said active layer to absorb the stimulated emission generated by said active layer; and wherein said periodical structure is in the area of said emission.

* * * * *